United States Patent

Kawabata

[11] Patent Number: 5,876,870
[45] Date of Patent: Mar. 2, 1999

[54] BATTERY RESIDUAL AMOUNT DISPLAY CIRCUIT

[75] Inventor: Hisashi Kawabata, Tokyo, Japan

[73] Assignee: NEC Corporation, Tokyo, Japan

[21] Appl. No.: 987,825

[22] Filed: Dec. 9, 1997

[30] Foreign Application Priority Data

Dec. 9, 1996 [JP] Japan ..................................... 8-328278

[51] Int. Cl.$^6$ ................................................. H01M 10/48
[52] U.S. Cl. .............................. 429/91; 429/92; 340/636; 324/433
[58] Field of Search .................................. 429/90, 91, 92; 340/636, 635; 324/435, 433

[56] References Cited

U.S. PATENT DOCUMENTS 5,479,085  12/1995  Honda et al. ........................ 429/92 X
5,518,835  5/1996   Simmonds ............................. 429/90
5,658,682  8/1997   Usuda et al. ........................ 429/92

FOREIGN PATENT DOCUMENTS 6-224844  8/1994  Japan .

*Primary Examiner*—Anthony Skapars
*Attorney, Agent, or Firm*—Ostrolenk, Faber, Gerb & Soffen, LLP

[57] ABSTRACT

At step S21, a residual amount judging section of abattery residual amount display circuit measures a battery voltage. If a mode transition is detected at step S22, the process returns to step S21 without executing the subsequent steps. If it is judged at step S23 that the operation mode is a reception-waiting mode, the process goes to step S24, where the battery amount judging section judges a battery residual amount by comparing the detected battery voltage with threshold values. If the operation mode is judged to be a transmission mode, the battery residual amount judging section determines a voltage drop during a transmission at step S25, and converts the voltage drop into a battery voltage of a reception waiting mode at step S26 by subtracting the voltage drop from a batter voltage obtained in a reception waiting mode immediately before the mode transition. At step S27, the battery residual amount judging section determines a battery residual amount by comparing the converted battery voltage with the threshold values.

9 Claims, 8 Drawing Sheets

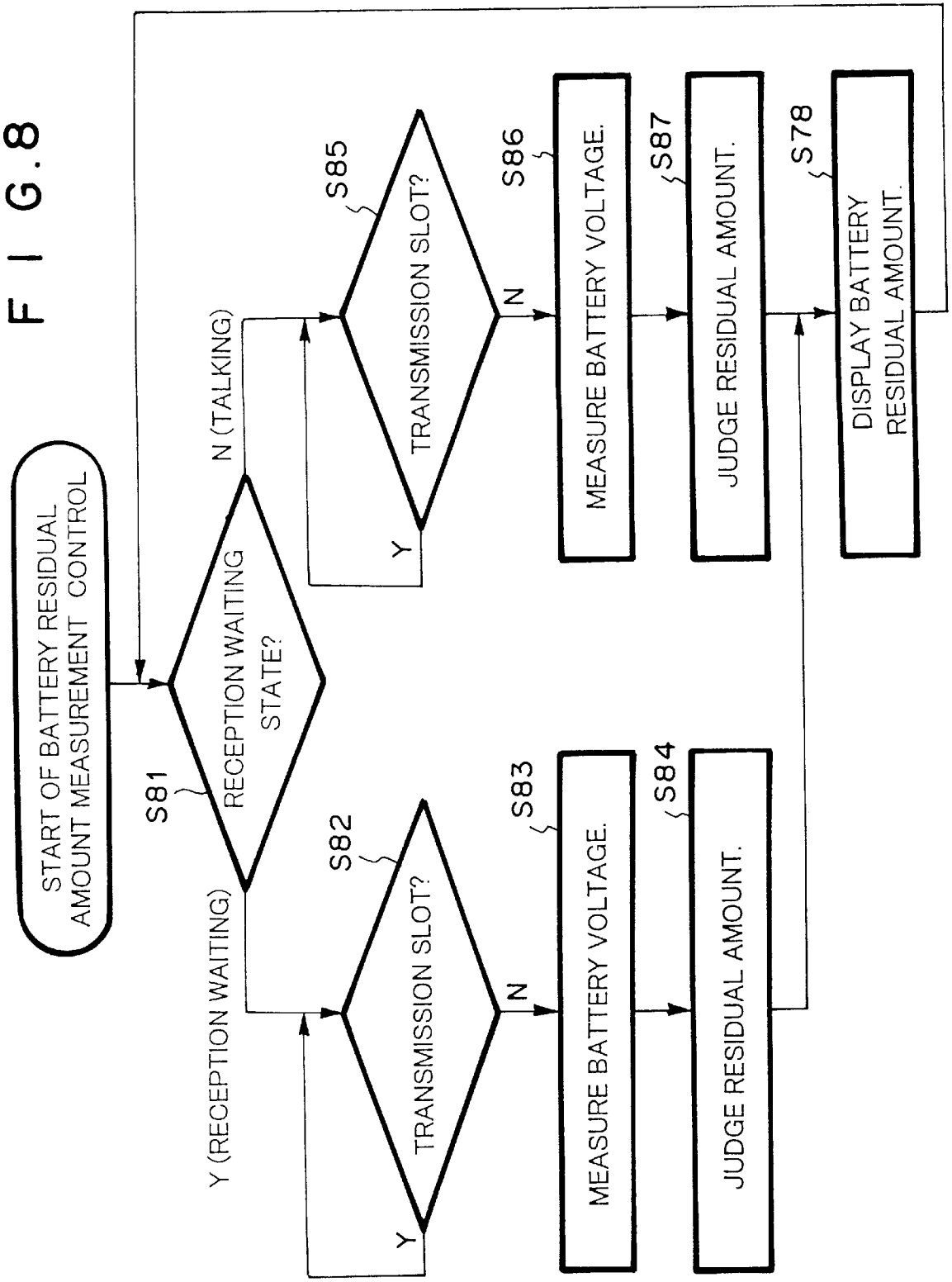

BATTERY RESIDUAL AMOUNT DISPLAY CIRCUIT

BACKGROUND OF THE INVENTION

1. Field of the Invention

The present invention relates to a battery residual amount display circuit and particularly, to a battery residual amount display circuit for displaying the residual amount of a battery used in an apparatus having a plurality of operation modes, such as a radio apparatus.

2. Description of the Prior Art

The Li (lithium)-ion battery has a feature that the battery voltage decreases approximately like a first-order function as it discharges. Therefore, it is possible to know the residual amount of a battery by measuring its output voltage. In an apparatus using a Li-ion battery as a power supply, the residual amount of the battery is determined by measuring its output voltage and displayed on an indicator.

For example, Japanese Unexamined Patent Publication No. Hei. 6-224844 discloses a radio apparatus having a battery residual amount display circuit. In this radio apparatus, as shown in FIG. 7, the output voltage of Li-ion battery 71 is converted into an operation voltage by power supply circuit 72, to thereby produce a stable power supply voltage. On the other hand, the output voltage of Li-ion battery 71 is converted by A/D converter 73 into a digital value, which is detected by control section 74. The battery residual amount is judged based on a detected voltage value, and a judged battery residual amount is displayed on indicator 75.

Having, for instance, a microprocessor as a main control unit, control section 74 controls a radio circuit section (not shown). At the same time, control section 74, specifically its residual amount judging section 76, compares the battery output voltage with a plurality of threshold values and thereby judges which of a plurality of levels the battery residual amount belongs to. In performing the above judgment, to eliminate a measurement error depending on the operation mode, the residual amount judging section 76 changes the threshold values based on mode information that is supplied from the main control unit. The operation of residual amount judging section 76 will be described below with reference to FIG. 8.

In residual amount judging section 76, first, at step S81, the operation mode of the radio apparatus is checked. If the operation mode is a reception-waiting mode, at step S82 the process waits for a time slot other than a transmission slot. The battery voltage is measured at step S83. Then, at step S84, the battery residual amount is judged by comparing the measured battery voltage with threshold values that were stored in advance.

If the operation mode is judged to be a talking mode at step S81, residual amount judging section 76 operates in the same manner as in the case of the reception-waiting mode. That is, the process waits for a time slot other than a transmission slot at step S85, and the battery voltage is measured at step S86. The battery residual amount is judged at step S87 by comparing the measured battery voltage with threshold values. However, the threshold values used in the talking mode is different from those used in the reception-waiting mode. This is because the discharge current (power consumption) in the talking mode is larger than in the reception waiting mode and the battery voltage is lowered accordingly.

The battery residual amount that has been measured in the above manner is displayed on indicator 75 at step S78.

In the conventional battery residual amount display circuit, the battery residual amount is judged based on the battery voltage on the assumptions that the discharge current (power consumption) is constant in each mode and that the relationship between the discharge current and the voltage drop never changes. However, the discharge current varies even in the same mode and the relationship between the discharge current and the voltage drop varies with the ambient temperature and the number of charge/discharge cycles. Therefore, the conventional battery residual amount display circuit has a problem that the battery residual amount cannot be judged in a stable manner.

Moreover, the residual amount of a battery is not judged in talking mode so as to avoid the influence of voltage drop in transmission slot, thus there was a disadvantage that the battery residual amount judgement becomes inaccurate in the apparatus which has lengthy talking mode.

SUMMARY OF THE INVENTION

An object of the present invention is to provide a battery residual amount display circuit which can judge the battery residual amount in a stable manner.

According to the present invention, there is provided a battery residual amount display circuit which is incorporated in an apparatus having a plurality of operation modes and equipped with a battery as a power supply and which displays a residual amount of the battery, which comprises voltage detecting means for detecting an output voltage of said battery; mode detecting means for detecting an operation mode of the apparatus; battery residual amount judging means for executing judgment of the residual amount by comparing the output voltage with predetermined threshold values when the mode detecting means detects a particular mode which is one of the plurality of operation modes, and for judging the residual amount by determining a voltage drop based on the output voltages, converting the voltage drop into a equivalent output voltage corresponding to the particular mode, and comparing the equivalent output voltage with the predetermined threshold values when the mode detecting means detects a mode other than the particular mode; and display means for displaying the judgment result of the battery residual amount judging means.

According to the present invention, the above battery residual amount display circuit may be configured such that the voltage detecting means detects the output voltages at a predetermined cycle, and wherein the battery residual amount judging means determines an average of the output voltages that are detected by the voltage detecting means in a predetermined period, and judges the residual amount by comparing the average with the predetermined threshold values when the mode detecting means detects the particular mode which is one of the plurality of operation modes, and judges the residual amount by determining the voltage drop based on the averages, converting the voltage drop into the equivalent output voltage corresponding to the particular mode, and comparing the equivalent output voltage with the threshold values when the mode detecting means detects a mode other than the particular mode.

According to the present invention, when the mode detecting means detects a mode transition during the predetermined period, the battery residual amount judging means stops an operation of determining the average and restarts determining the average of the output voltages that are detected by the voltage detecting means in another predetermined period.

In a reception waiting mode, the residual amount judging section judges the battery residual amount by comparing the measured battery voltage with the threshold values that were stored in advance. In a transmission mode, a voltage drop after establishment of the transmission mode is determined and then the voltage drop is converted into a battery voltage of a reception-waiting mode. In judging the battery residual amount, the same threshold voltages as in the case of the reception-waiting mode are used.

A voltage drop in each mode represents a variation in battery residual amount in such a way as not to depend on the operation mode or current consumption. The battery residual amount can be judged in a stable manner in which the voltage drop is converted into a battery voltage of a reception waiting mode that is less affected by the temperature and the number of charge/discharge cycles as compared to talking mode(the power consumption is smaller in the reception waiting mode than in talking mode).

BRIEF DESCRIPTION OF THE DRAWINGS

FIG. 8 is a flowchart showing the operation of a residual amount judging section 76 shown in FIG. 7.

DETAILED DESCRIPTION OF THE PREFERRED EMBODIMENTS

An embodiment of the present invention will be hereinafter explained with reference to the accompanying drawings.

Figure 1:
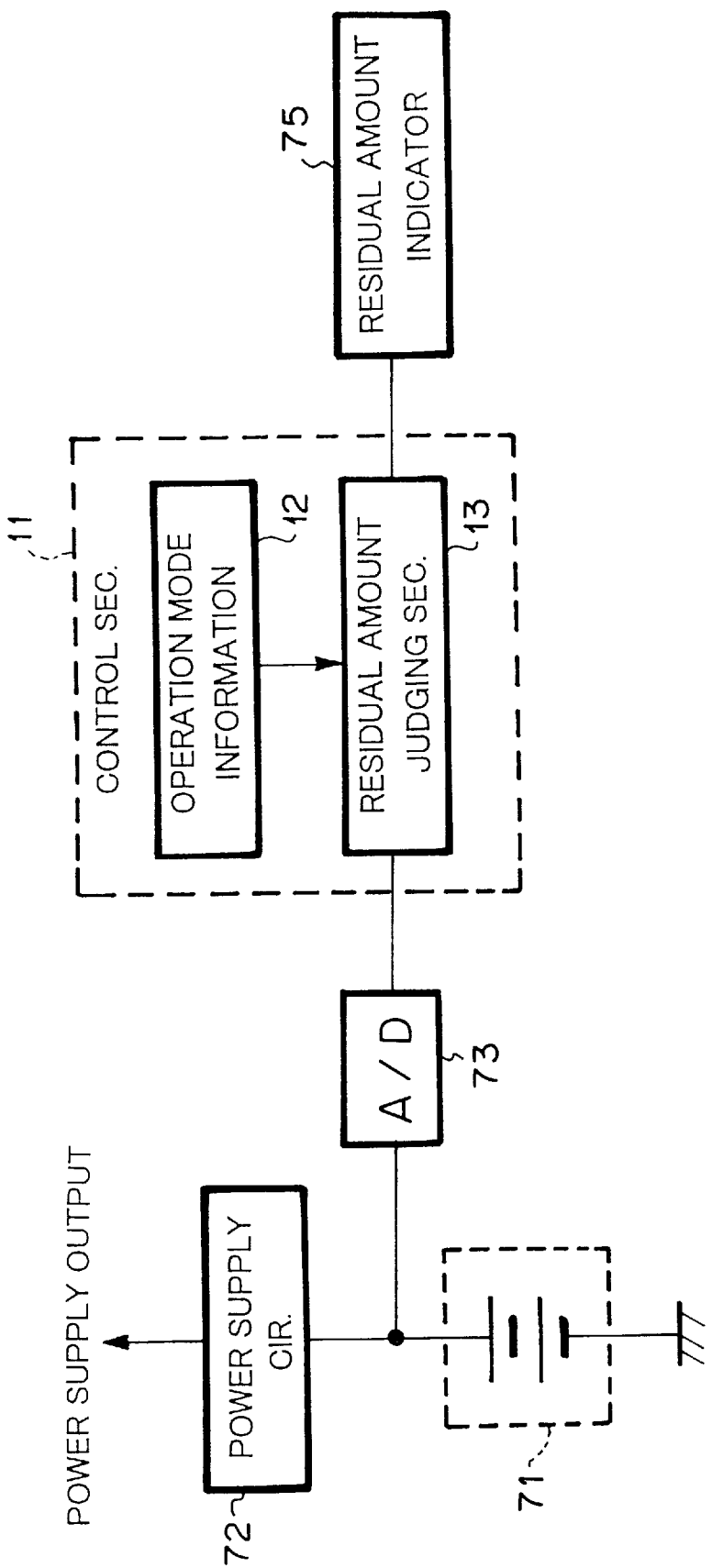
FIG. 1 is a block diagram showing an embodiment of the invention.
Figure 7:
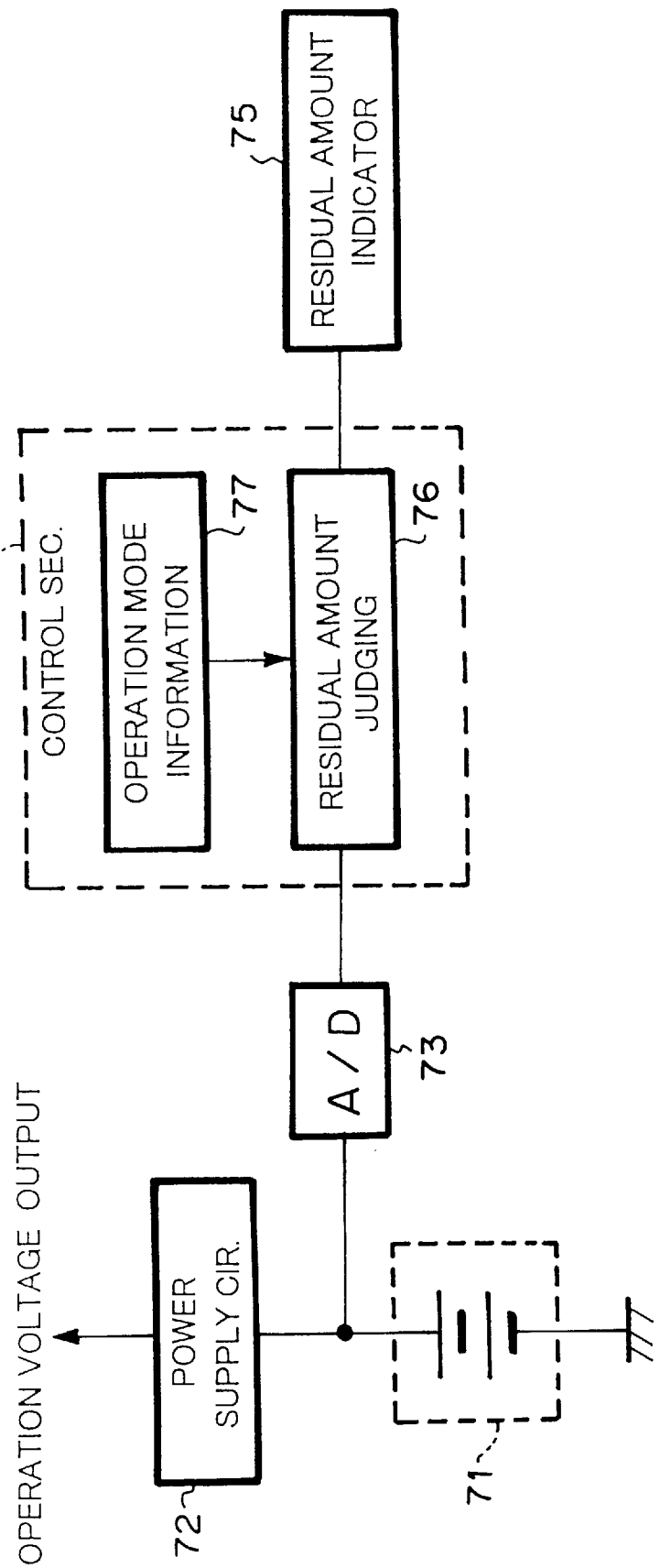
FIG. 7 is a block diagram of a conventional battery residual amount display circuit.

FIG. 1 shows an embodiment of a battery residual amount display circuit according to the present invention. The components in FIG. 1 that are the same as the corresponding components of the conventional display circuit shown in FIG. 7 are given the same reference numerals as in FIG. 7 and descriptions therefor will be omitted. It is noted that this battery residual amount display circuit is directed to such batteries that a discharge-induced variation in output voltage can be regarded as a variation in battery residual amount as long as the discharge current falls within a given range. In other words, this battery residual amount display circuit is directed to such batteries that the slope of the battery residual amount vs. battery output voltage characteristic curve can be regarded as substantially remaining the same even if the discharge current value is varied in a given range.

The battery residual amount display circuit of this embodiment is incorporated in a radio apparatus, and has residual amount indicator 75 and control section 11 for controlling a radio circuit section (not shown) of the radio apparatus and judging the residual amount of battery 71. As in the case of the conventional display circuit, control section 11 has a residual amount judging section 13 for judging the battery residual amount based on operation mode information 12 that is supplied from a main control unit (not shown) which constitutes of a microprocessor or the like and a battery voltage value that is supplied from A/D converter 73. The battery residual amount display circuit of the embodiment is different from the conventional one in that the operation mode information includes a high power transmission mode and a low power transmission mode and in the operation of residual amount judging section 13.

Figure 2:
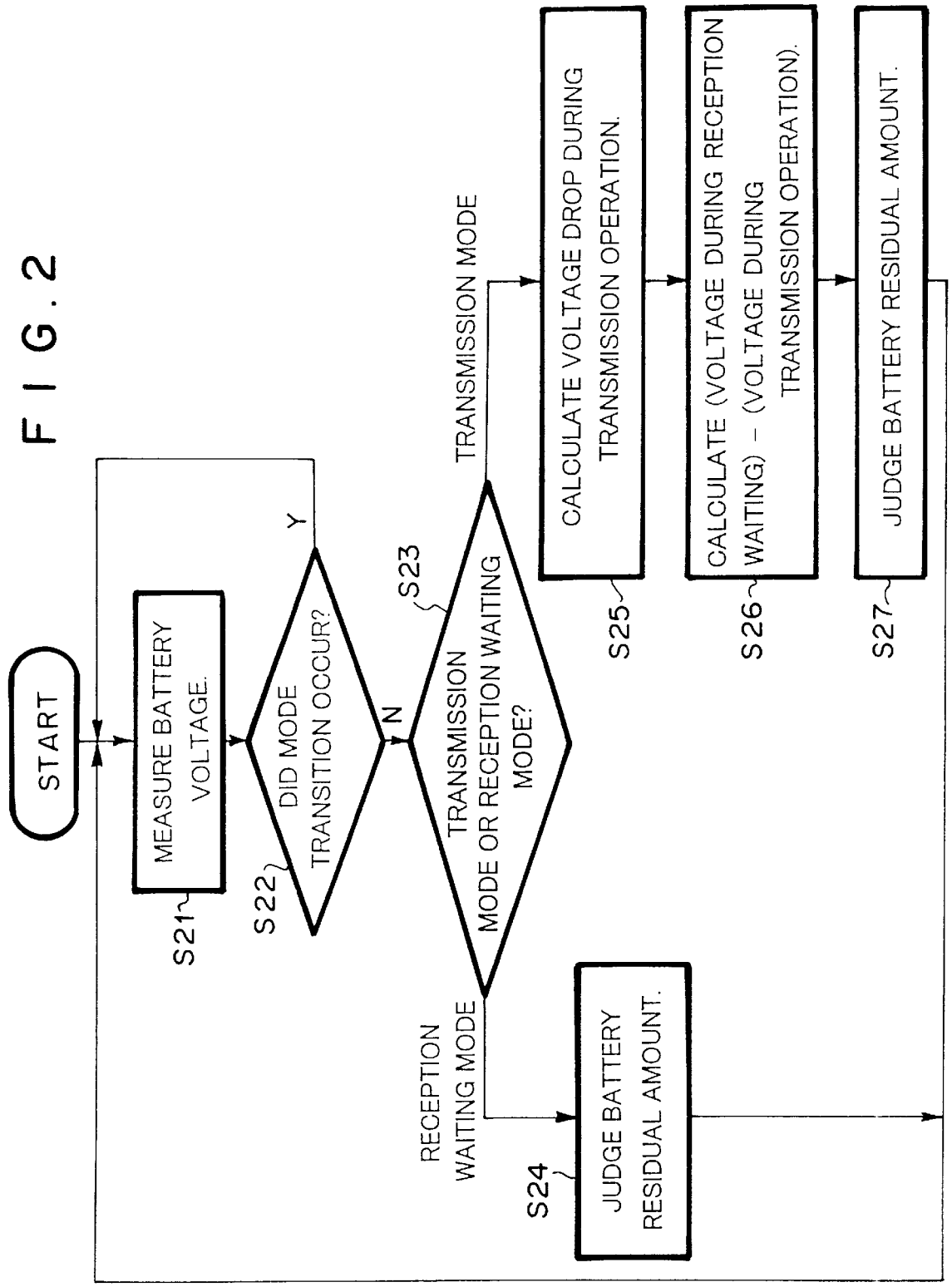
FIG. 2 is a flowchart showing the operation of a residual amount judging section 13 shown in FIG. 13.

Next, the operation of residual amount judging section 13 of FIG. 1 will be explained below with reference to FIG. 2.

First, at step S21 the battery voltage is measured, that is, the output of A/D converter 73 is read. Then, at step S22, residual amount judging section 13 judges whether a mode transition occurred during the battery voltage measurement. If a mode transition occurred, the process returns to step S21 to again perform a battery voltage measurement.

If no mode transition occurred, at step S23 residual amount judging section 13 judges the operation mode of the radio apparatus by referring to operation mode information 12. If the operation mode is a reception waiting mode, at step S24 residual amount judging section 13 judges the battery residual amount by comparing the measured battery voltage with the threshold values. On the other hand, if the operation mode is a transmission mode, at step S25 residual amount judging section 13 calculates a voltage drop during a transmission operation. At step S26, residual amount judging section 13 subtracts the calculated voltage drop from the stored battery voltage which had been measured during the reception waiting operation which ended simultaneously with starting of the present transmission operation. Further, at step S27 residual amount judging section 13 judges the battery residual amount by comparing a subtraction result with the threshold values. The threshold values used at this step are the same as those used in the reception-waiting mode.

Figure 3:
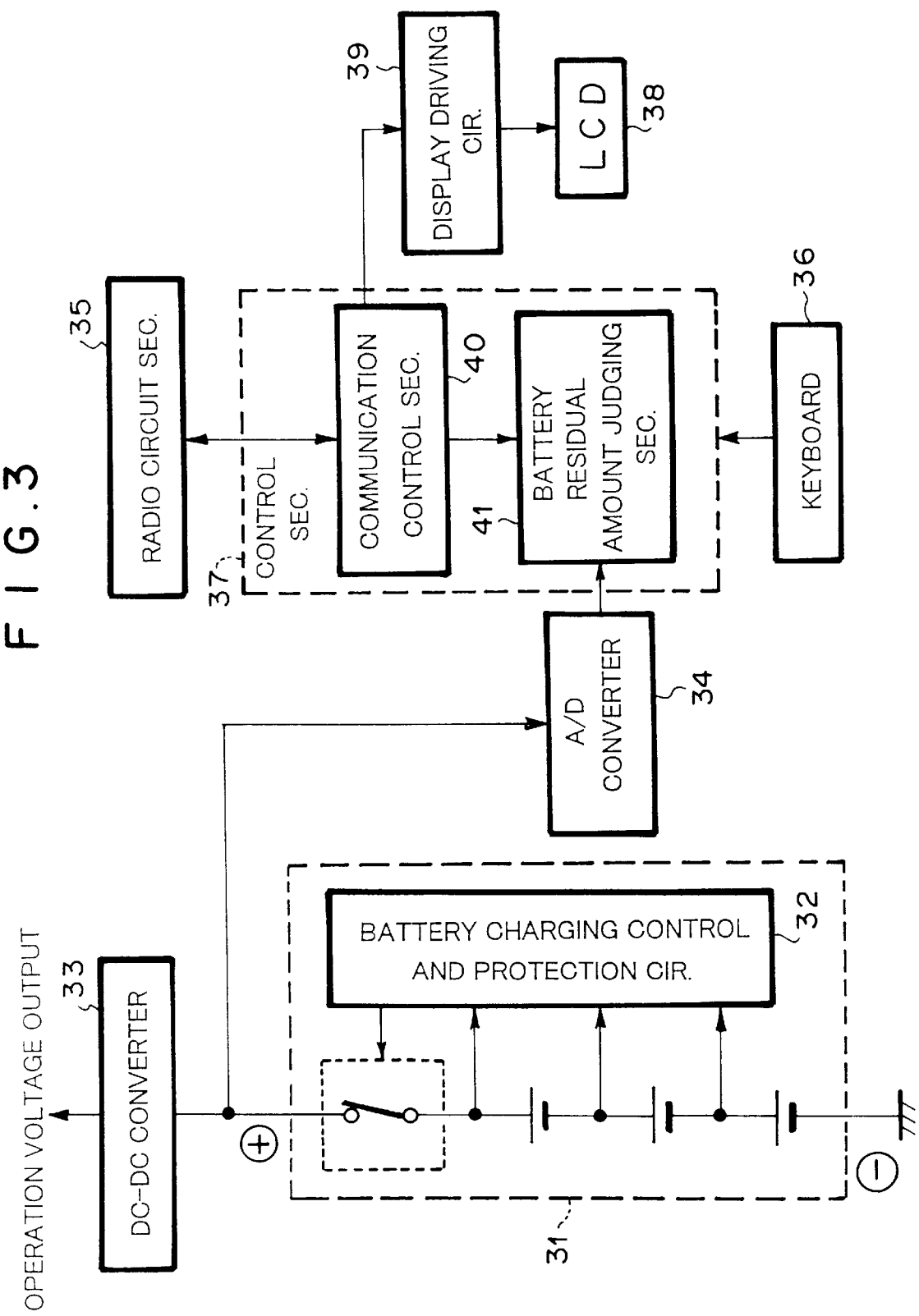
FIG. 3 is a block diagram showing a more specific embodiment of the invention.

Next, a more specific embodiment of the invention will be hereinafter explained. FIG. 3 shows the more specific embodiment of the invention. A radio apparatus of FIG. 3 has Li-ion battery pack 31 in which three Li-ion cells are series-connected to each other. The battery pack 13 incorporates battery-charge-controlling/protection circuit 32 for managing the states of the individual cells and for coping with over discharge.

The radio apparatus of FIG. 3 comprises DC-DC converter 33 for converting the output voltage of battery pack 31 into the predetermined voltage that is to be output as an operation voltage and A/D converter 34 for converting the output voltage of battery pack 31 into a digital value. The radio apparatus further comprises radio circuit section 35 for performing a radio communication, keyboard 36 for inputting various instructions such as a battery-residual-amount-display instruction, control section 37, constituted of a microprocessor etc., for controlling the respective sections including radio circuit section 35, LCD 38 for displaying the battery residual amount, and display driving circuit 39 for driving LCD 38 while being controlled by control section 37. Control section 37 has communication control section 40 for controlling radio circuit section 35 and battery-residual-amount-judging section 41 for judging the battery residual amount.

Figure 4:
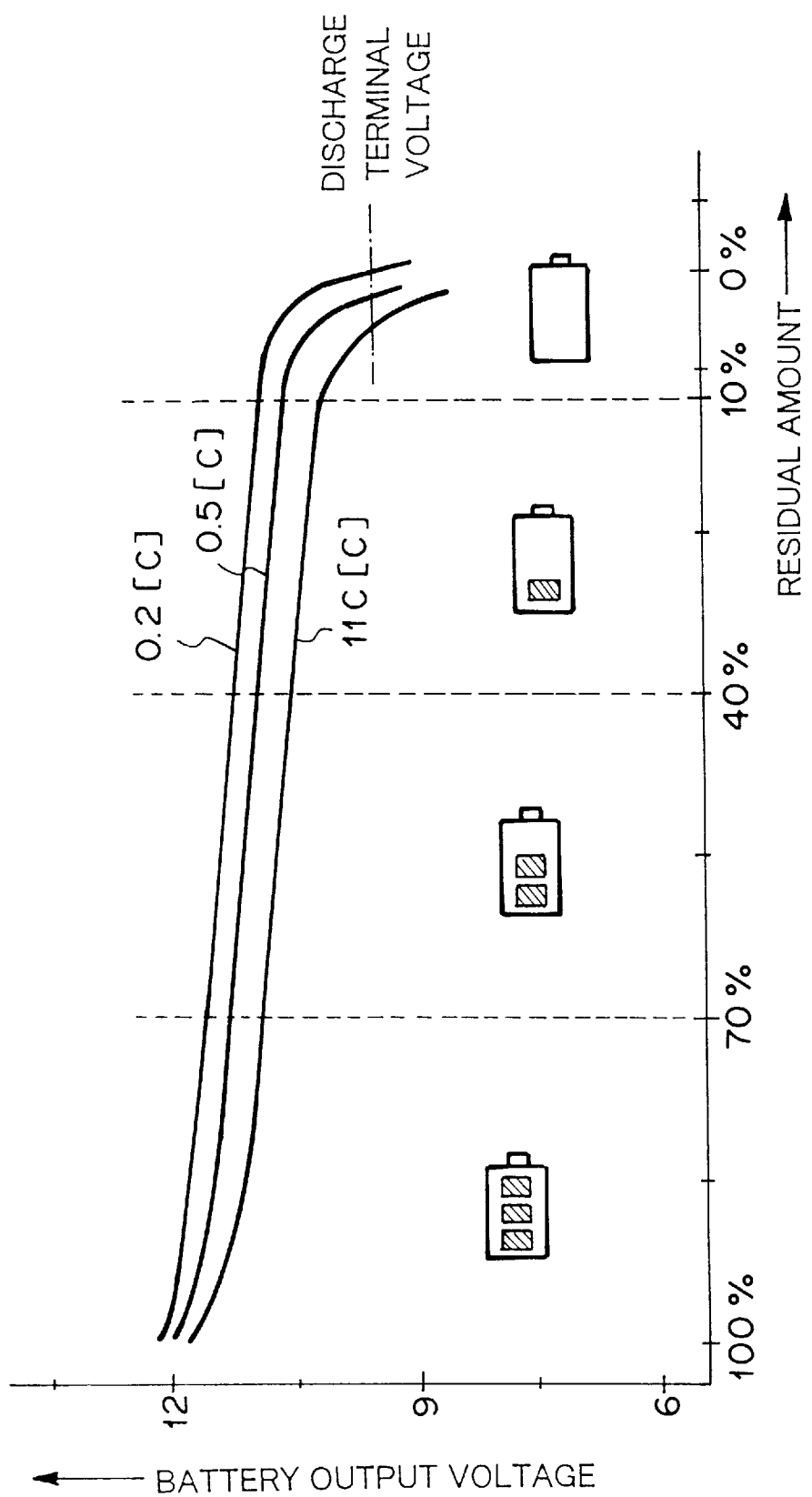
FIG. 4 is a graph showing a discharge characteristic of a battery pack 31 shown in FIG. 3.

For example, Li-ion pattern pack 31 has a discharge characteristic shown in FIG. 4. In FIG. 4, the axis of abscissas represents the residual amount of battery pack 31 in terms of percent and the axis of ordinates represents the output voltage of battery pack 31 in terms of voltage. Values 0.2 [C], 0.5 [C], and 1 [C] in FIG. 4 represent discharging rates. For example, the discharging rate 1 [C] represents a discharging current that consumes the nominal capacity of battery pack 31 in one hour.

As shown in FIG. 4, in the Li-ion battery, unlike the case of the Ni-Cd battery and the like, the output voltage decreases approximately like a first-order function as the residual amount decreases. Where the discharging rate varies due to the impedance characteristic of the Li-ion battery 31 or some other factor, the output voltage is lower when the discharging rate is higher. Further, if discharging rates fall within a given range, for instance, from 0.2 [C] to 1 [C], the slopes of the battery residual amount vs. battery output voltage characteristic curves are substantially the same (particularly in a residual amount range of 10–85%). In the present invention, the battery residual amount is judged in a stable manner by utilizing the fact that the slope of the battery residual amount vs. battery output voltage characteristic curve is constant irrespective of the discharging rate.

Figure 5:
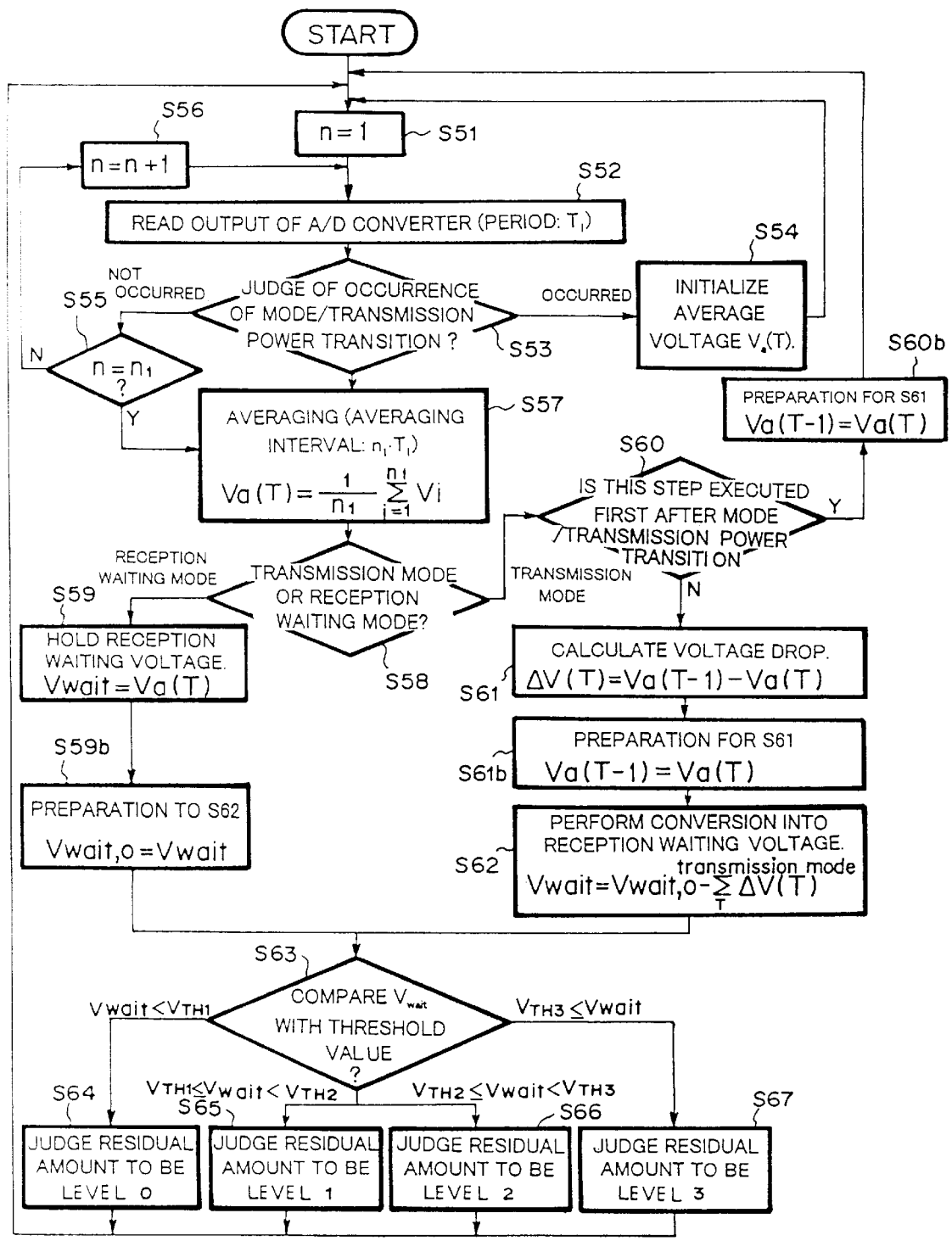
FIG. 5 is a flowchart showing the operation of a battery residual amount judging section 41 shown in FIG. 3.

The operation of the battery residual amount display circuit in the radio apparatus of FIG. 3, particularly the operation of battery residual amount judging section 41, will be explained below with reference to FIG. 5.

Battery residual amount judging section 41 initializes variable n at step S51, and read an output $V_n$ of A/D converter 34 at step S52. At step S53, battery residual amount judging section 41 reads communication mode information from communication control section 40 and judges whether a mode transition, for instance, from a reception waiting mode to a transmission mode or from a high power transmission mode to a low power transmission mode, occurred after the reading of the output $V_n$.

If a mode transition occurs, the load current of the radio apparatus varies and a step-like variation occurs in the battery output voltage. The same thing occurs with a power transition during a transmission. Now assume a case where the current consumption in the reception waiting mode of the radio apparatus is 0.2 [C] in terms of the discharging rate, the current consumption in the low power transmission mode is 0.5 [C] in terms of the discharging rate, and the current consumption in the high power transmission mode is 1 [C]. In this case, a transition from the reception waiting mode to the low power transmission mode causes a voltage drop of 0.2 [V] and a transition from the reception waiting mode to the high power transmission mode cases a voltage drop of 0.6 [V]. A transition from the low power transmission mode to the high power transmission mode causes a voltage drop of 0.4 [V]. The voltage drop due to different discharging rates varies depending on the ambient temperature and the number of charge/discharge cycles of battery pack 31.

In this embodiment, to measure the output voltage of battery pack 31 more correctly, an average voltage is determined as explained below. Therefore, variations in battery output voltage as explained above should be eliminated. For the shake of this elimination, battery residual amount judging section 41 judges of occurrence of a mode transition at step S53.

If it is judged at step S53 that a mode transition occurred, at step S54 battery residual amount judging section 41 initializes an average voltage $V_a(T)$. Conversely, if no mode transition occurred, at step S55 battery residual amount judging section 41 compares variable n with variable $n_1$ ($n_1$: predetermined integer). If the comparison reveals that n is not equal to $n_1$, an operation n=n+1 is performed at step S56 and an output $V_n$ of A/D converter 34 is again read at step S52.

In this manner, at steps S51–S56 battery residual amount judging section 41 reads the output $V_n$ of A/D converter 34 $n_1$ times in the state that no mode transition occurs. The period of reading the output $V_n$ of A/D converter 34 is set at $T_1$.

Then, at step S57, battery residual amount judging section 41 calculates the average of the read-out outputs $V_n$ (i=1, 2, ..., $n_1$). That is, an average voltage $V_a$ (T) is calculated according to Equation (1)

$$V_a(T) = \frac{1}{n_1} \cdot \sum_{i=1}^{n_1} V_i \qquad (1)$$

By determining, in the above manner, the average voltage over the period $n_1.T_1$ (hereinafter referred to as "averaging interval") while the radio apparatus operates in a single mode, a variation in the output voltage of the battery pack 31 due to a very small load variation in the radio apparatus in that mode can be eliminated. The averaging interval $n_1.T_1$ is determined in consideration of the load variation characteristics of the radio apparatus, the update interval of the battery residual amount display, and the execution load of the microprocessor of control section 37. Specific examples of the period $T_1$ and the averaging interval $n_1.T_1$ are 20 ms and 200 ms ($n_1$=10), respectively.

Then, at step S58, battery residual amount judging section 41 judges of the current operation mode of the radio apparatus. If the operation mode is a reception waiting mode, at step S59 battery residual amount judging section 41 causes the average voltage $V_a(T)$ to be stored, as a reception waiting voltage $V_{wait}$, in a memory circuit (not shown). The reception waiting voltage $V_{wait}$ is assigned to $V_{wait,0}$ in the memory circuit to prepare for step 62.

On the other hand, if it is judged at step S58 that the operation mode is a transmission mode, at step S60 battery residual amount judging section 41 judges whether this step is executed for the first time after the mode transition. If it is executed for the first time after the mode transition, the process returns to step S51 after assigning $V_a(T)$ to $V_a(T-1)$ in the memory circuit at step S61b to prepare for step S61. If step is executed for the second or later time, at step S61 battery residual amount judging section 41 calculates the difference between the average voltage $V_a(T)$ just determined and the average voltage $V_a(T-1)$ that was previously determined, that is, avoltage drop $\Delta V(T)$. At step S61b, $V_a(T)$ is assigned to $V_a(T-1)$ to prepare for the next execution of step S61. At step S62, battery residual amount judging section 41 calculates a new $V_{wait}$ (reception-waiting-converted voltage) by subtracting the sum of the voltage drops after the establishment of the transmission mode from the reception waiting voltage $V_{wait}$ that was obtained immediately before the establishment of the transmission mode. That is, a calculation is performed according to Equation (2).

$$V_{wait} = V_{wait,0} - \sum_{T}^{transmission\ mode} \Delta V(T) \qquad (2)$$

Figure 6:
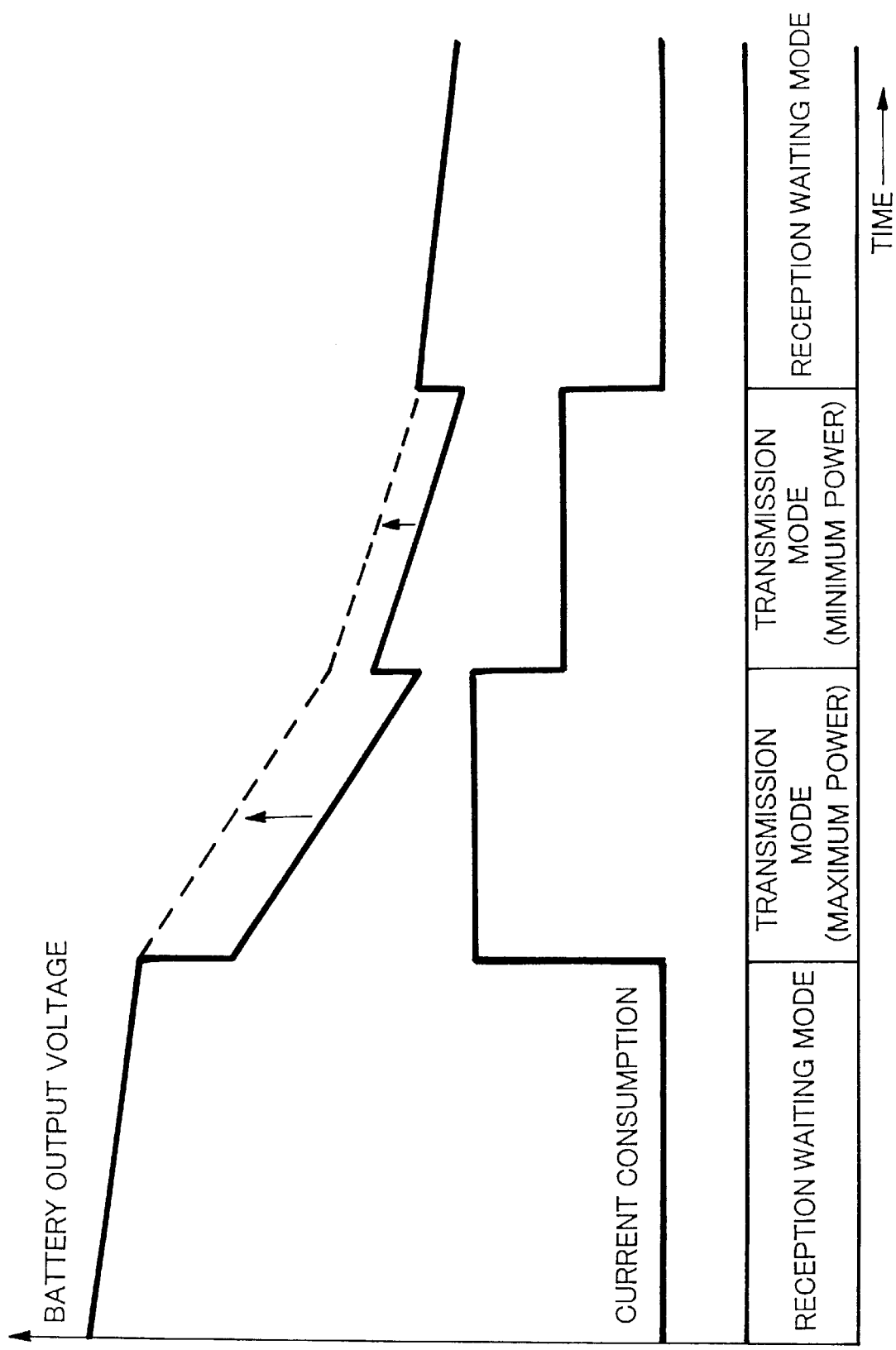
FIG. 6 is a graph showing a relationship between the time and the battery voltage/power consumption.

As shown in FIG. 4, in the Li-ion battery, the slope of the residual amount vs. output voltage characteristic curve can be regarded as the same in a given discharging rate range (in the example of FIG. 4, 0.2–1 [C]). Therefore, the voltage value that is converted into a reception waiting voltage can be obtained by subtracting the sum of the voltage drops in the transmission mode from the reception waiting voltage that was obtained immediately before the transition to the transmission mode in the above manner. The same thing applies to a case of a transition to a different power transmission mode in the midst of a transmission mode. FIG. 6 shows an example of the relationship between the time (mode transitions) and the battery voltage/power consumption. In FIG. 6, the reception-waiting-converted voltage is indicated by a broken line.

Then, battery residual amount judging section 41 compares the reception waiting (converted) voltage $V_{wait}$ that was obtained at step S59 or S62 with a plurality of threshold values. Assume that in the example of FIG. 4 that the threshold values are set such that $V_{th1}$=10.75 [V], $V_{th2}$=11.1 [V], and $V_{th3}$=11.4 V. In this case, when $V_{wait}<V_{th1}$, the residual amount is judged to be smaller than 10%. When $V_{th1} \leq V_{wait} <V_{th2}$, the residual amount is judged to be greater than or equal to 10% and smaller than 40%. When $V_{th2} \leq V_{wait} <V_{th3}$, the residual amount is judged to be greater than or equal to 40% and smaller than 70%. When $V_{th3} \leq V_{wait}$, the residual amount is judged to be greater than or equal to 70%. The threshold values are set in consideration of the output voltage detection accuracy, the ability of LCD 38, the output voltage vs. residual amount characteristic of battery pack 31, the voltage-current consumption characteristic of the radio apparatus, and other factors.

Then, battery residual amount judging section 41 informs display driving circuit 39 of the residual amount level that was judged at step S63. Display driving circuit 39 thus informed causes LCD 38 to display the residual amount. Examples of residual amount display are also shown in the graph of FIG. 4.

As described above, this embodiment makes it possible to judge the battery amount in a stable manner without being affected by a very small voltage variation due to a mode transition or in a single mode.

In the invention, in a particular mode such as the reception-waiting mode in which the current consumption is small, the residual amount is judged by comparing a detected battery output voltage itself with the threshold values. In a mode other than the particular mode, and a voltage drop in the mode concerned is determined and then converted into an output voltage of the particular mode by subtracting the voltage drop from an battery output voltage obtained in a particular mode immediately before the transition to the mode concerned. Therefore, the residual amount can be judged in a stable manner without being affected by the ambient temperature or the number of charge/discharge cycles. Moreover, the residual amount can be judged in any mode.

Further, since the output voltage value in each mode is determined as an average over a given period, a very small voltage variation in each mode can be eliminated, thereby enabling a more stable residual amount judgment.

What is claimed is:

1. A battery residual amount display circuit which is incorporated in an apparatus having a plurality of operation modes and equipped with a battery as a power supply and which displays a residual amount of the battery, which comprises:

voltage detecting means for detecting an output voltage of said battery;

mode detecting means for detecting an operation mode of said apparatus;

battery residual amount judging means for executing judgment of said residual amount by comparing said output voltage with predetermined threshold values when said mode detecting means detects a particular mode which is one of said plurality of operation modes, and for judging said residual amount by determining a voltage drop based on said output voltages, converting said voltage drop into a equivalent output voltage corresponding to said particular mode, and comparing said equivalent output voltage with said predetermined threshold values when said mode detecting means detects a mode other than said particular mode; and display means for displaying said judgment result of the battery residual amount judging means.

2. The battery residual amount display circuit according to claim 1, wherein said voltage detecting means detects said output voltages at a predetermined cycle, and wherein said battery residual amount judging means determines an average of said output voltages that are detected by said voltage detecting means in a predetermined period, and judges said residual amount by comparing said average with said predetermined threshold values when said mode detecting means detects said particular mode which is one of said plurality of operation modes, and judges said residual amount by determining said voltage drop based on said averages, converting said voltage drop into said equivalent output voltage corresponding to said particular mode, and comparing said equivalent output voltage with said threshold values when said mode detecting means detects a mode other than said particular mode.

3. The battery residual amount display circuit according to claim 2, when said mode detecting means detects amode transition during said predetermined period, said battery residual amount judging means stops an operation of determining said average and restarts determining said average of said output voltages that are detected by said voltage detecting means in another predetermined period.

4. The battery residual amount display circuit according to claim 1, wherein said particular mode is a reception waiting mode.

5. The battery residual amount display circuit according to claim 2, wherein said particular mode is a reception waiting mode.

6. The battery residual amount display circuit according to claim 3, wherein said particular mode is a reception waiting mode.

7. The battery residual amount display circuit according to claim 1, wherein said apparatus is a radio apparatus.

8. The battery residual amount display circuit according to claim 2, wherein said apparatus is a radio apparatus.

9. The battery residual amount display circuit according to claim 3, wherein said apparatus is a radio apparatus.

* * * * *